(12) United States Patent
Lu et al.

(10) Patent No.: US 9,887,317 B2
(45) Date of Patent: Feb. 6, 2018

(54) LIGHT-EMITTING DEVICE AND MANUFACTURING METHOD THEREOF

(71) Applicant: EPISTAR CORPORATION, Hsinchu (TW)

(72) Inventors: Tien-Chang Lu, Hsinchu (TW); Chiao-Yun Chang, Taipei (TW); Heng Li, Yilan County (TW)

(73) Assignee: EPISTAR CORPORATION, Hsinchu (TW)

(*) Notice: Subject to any disclaimer, the term of this patent is extended or adjusted under 35 U.S.C. 154(b) by 6 days.

(21) Appl. No.: 14/636,939

(22) Filed: Mar. 3, 2015

(65) Prior Publication Data

US 2016/0064596 A1   Mar. 3, 2016

(30) Foreign Application Priority Data

Sep. 3, 2014  (TW) .............................. 103130523 A

(51) Int. Cl.
*H01L 29/15* (2006.01)
*H01L 33/06* (2010.01)
(Continued)

(52) U.S. Cl.
CPC ............ *H01L 33/06* (2013.01); *H01L 33/007* (2013.01); *H01L 33/12* (2013.01)

(58) Field of Classification Search
None
See application file for complete search history.

(56) References Cited

U.S. PATENT DOCUMENTS 7,842,531 B2   11/2010  Tansu et al.
8,030,641 B2   10/2011  Tansu et al.
(Continued)

FOREIGN PATENT DOCUMENTS

JP     3279266 B2     4/2002
JP     3338778 B2    10/2002
WO  2013178425 A1   12/2013

OTHER PUBLICATIONS

Hongping Zhao, et al. "Approaches for high internal quantum efficiency green InGaN light-emitting diodes with large overlap quantum wells" accepted Jun. 22, 2011; published Jul. 1, 2011 (C) 2011 OSA Jul. 4, 2011 / vol. 19, No. S4 /Optics Express, Consists of 17 pages.

(Continued)

*Primary Examiner* — Fazli Erdem
*Assistant Examiner* — Scott R Wilson
(74) *Attorney, Agent, or Firm* — Patterson + Sheridan, LLP

(57) ABSTRACT

A light-emitting device including a substrate; a first conductivity semiconductor layer disposed on the substrate; a first barrier disposed on the first conductivity semiconductor layer; a well disposed on the first barrier and including a first region having a first energy gap and a second region having a second energy gap and closer to the semiconductor layer than the first region; a second barrier disposed on the well; and a second conductivity semiconductor layer disposed on the second barrier; wherein the first energy gap decreases along a stacking direction of the light-emitting device and has a first gradient, the second energy gap increases along the stacking direction and has a second gradient, and an absolute value of the first gradient is smaller than an absolute value of the second gradient.

17 Claims, 11 Drawing Sheets

(51) Int. Cl.
*H01L 33/00* (2010.01)
*H01L 33/12* (2010.01)

(56) References Cited

U.S. PATENT DOCUMENTS

| | | | |
|---|---|---|---|
| 8,659,005 | B2 | 2/2014 | Tansu et al. |
| 2008/0144685 | A1 | 6/2008 | Tansu et al. |
| 2009/0224226 | A1 | 9/2009 | Huang et al. |
| 2009/0258452 | A1 | 10/2009 | Enya et al. |
| 2010/0244087 | A1 | 9/2010 | Horie et al. |
| 2012/0037881 | A1 | 2/2012 | Kim et al. |
| 2013/0032810 | A1* | 2/2013 | Chen ............. H01L 33/007 257/76 |
| 2013/0161586 | A1 | 6/2013 | Okuno et al. |
| 2015/0108426 | A1* | 4/2015 | Hertkorn ........ H01L 33/06 257/13 |

OTHER PUBLICATIONS

Hongping Zhao et al. "Growths of staggered InGaN quantum wells light-emitting diodes emitting at 520-525 nm employing graded growth-temperature profile" Applied Physics Letters 95, 061104 (2009), consists of 4 pages.

R. Vaxenburg et al. "Suppression of Auger-stimulated efficiency droop in nitride-based light emitting diodes" Applied Physics Letters 102, 031120 (2013), consists of 6 pages.

Ronald A. Arif et al. "Polarization engineering via staggered InGaN quantum wells for radiative efficiency enhancement of light emitting diodes" Applied Physics Letter 91, 091110 (2007), consists of 4 pages.

Ronald A. Arif et al. "Spontaneous Emission and Characteristics of Staggered InGaN Quantum-Well Light-Emitting Diodes" IEEE Journal of Quantum Electronics, vol. 44, No. 6, Jun. 2008, consists of 8 pages.

Hongping Zhao et al. "Design Analysis of Staggered InGaN Quantum Wells Light-Emitting Diodes at 500-540 nm" IEEE Journal of Selected Topics in Quantum Electronics, vol. 15, No. 4, Jul./Aug. 2009, consists of 11 pages.

Chiao-Yun Chang et al. High efficiency InGaN/GaN light emitting diodes with asymmetric triangular multiple quantum wells Applied Physics Letters 104, 091111 (2014); doi: 10-1063/1.4867023, consists of 6 pages.

* cited by examiner

LIGHT-EMITTING DEVICE AND MANUFACTURING METHOD THEREOF

REFERENCE TO RELATED APPLICATION

This present application claims the right of priority based on TW application Serial No. 103130523, filed on Sep. 3, 2014, and the content of which is hereby incorporated by reference in its entirety.

TECHNICAL FIELD

The disclosure is related to a light-emitting device, and more particularly, a light-emitting device with a quantum well structure.

DESCRIPTION OF THE RELATED ART

In comparison with conventional light sources, the light-emitting diode with longer service life, smaller volume, lighter weight, and higher efficiency is widely adopted in optical display devices, traffic lights, information storage apparatuses, communication apparatuses, lighting apparatuses, and medical appliances. A light-emitting diode can be used solely or connected to other devices for forming a light-emitting device. For example, a light-emitting diode can be disposed on a substrate and then connected to a side of a carrier or soldered/glued on a carrier for forming a light-emitting device. Additionally, the carrier further includes an electrode which is electrically connected to the light-emitting device.

Generally, a light-emitting diode may include an n-type semiconductor layer, an active layer, and a p-type semiconductor layer. In order to enhance the light efficiency of light-emitting devices, a multi-quantum well structure is formed in the active layer. How to enhance the light efficiency by a quantum well structure becomes a major topic for improving the performance of light-emitting diodes.

SUMMARY OF THE DISCLOSURE

The disclosure is relative to a light-emitting device including a substrate; a first conductivity semiconductor layer disposed on the substrate; a first barrier disposed on the first conductivity semiconductor layer; a well disposed on the first barrier and including a first region having a first energy gap and a second region having a second energy gap and closer to the semiconductor layer than the first region; a second barrier disposed on the well; and a second conductivity semiconductor layer disposed on the second barrier; wherein the first energy gap decreases along a stacking direction of the light-emitting device and has a first gradient, the second energy gap increases along the stacking direction and has a second gradient, and an absolute value of the first gradient is smaller than an absolute value of the second gradient.

The disclosure is also relative to a method of manufacturing a light-emitting device including steps of: forming a first conductivity semiconductor layer on a substrate; forming a first barrier on the first conductivity semiconductor layer; forming a well on the first barrier, wherein the step of forming the well further includes: forming a first region by introducing a gallium based gas, an indium based gas, and a nitrogen based gas at a first operational temperature in a first interval; and forming a second region by introducing a gallium based gas, the indium based gas, and the nitrogen based gas at a second operational temperature in a second interval, wherein the second interval is later than the first interval; forming a second barrier on the well; and forming a second conductivity semiconductor layer on the second barrier.

BRIEF DESCRIPTION OF THE DRAWING

The accompanying drawing is included to provide easy understanding of the present application, and is incorporated herein and constitutes a part of this specification. The drawing illustrates the embodiment of the present application and, together with the description, serves to illustrate the principles of the present application.

DETAILED DESCRIPTION OF THE EMBODIMENTS

Figure 1A:
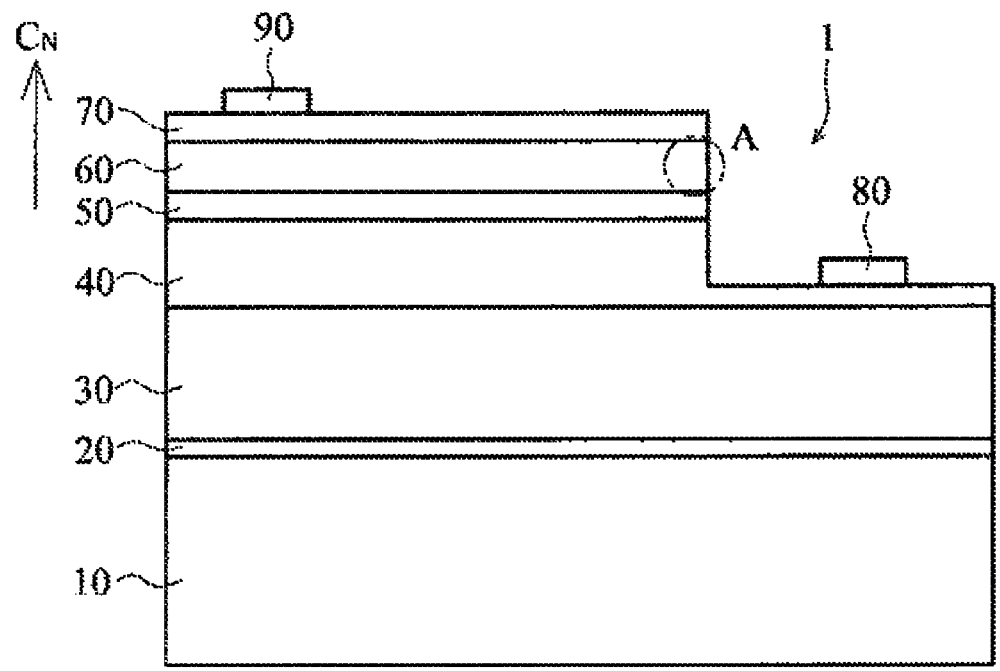
FIG. 1A shows a cross section of a light-emitting device in accordance with a first embodiment of the present application.

To better and concisely explain the present application, the same name or the same reference number given or appeared in different paragraphs or figures along the specification should has the same or equivalent meanings while it is once defined anywhere of the present application.

The following shows the description of embodiments of the present application in accordance with the drawing.

FIG. 1A shows a cross section of a light-emitting device in accordance with an embodiment of the present application. A light-emitting device 1 includes a substrate 10, a nucleation layer 20, a buffer layer 30, a first conductivity semiconductor layer 40, a strain releasing stack 50, an active layer 60, a second conductivity semiconductor layer 70, a first electrode 80, and a second electrode 90. In the embodiment, the abovementioned layers are epitaxialiy grown on the substrate 10 by approaches such as metal organic chemical vapor deposition (MOCVD) or molecular-beam epitaxy (MBE) and the growth direction is indicated by an arrow $C_N$. The substrate can be a single crystal substrate, an electrically conductive substrate, or an insulating substrate. The electrically conductive substrate can be a silicon substrate, a gallium nitride substrate, or a silicon carbide substrate. The insulating substrate can be a sapphire substrate. In the embodiment, each layer is epitaxially grown on the C plane of the sapphire substrate by MOCVD and the substrate 10 optionally has a patterned surface by etching for enhancing light extraction efficiency. Additionally, for epitaxially growing the layers, trimethylgallium (TMGa), triethylgallium (TEGa), trimethylaluminum (TMAl), and trimethylindium (TMIn) can be used as group IIIA sources; ammonia ($NH_3$) can be used as a group VA source; silane ($SiH_4$), and bis-cyclopentadienyl magnesium ($Cp_2Mg$) can be used as dopant sources.

In order to reduce lattice mismatch between the substrate 10 and the first conductivity semiconductor layer 40, the nucleation layer 20 and the buffer layer 30 can be sequentially formed between the substrate 10 and the first conductivity semiconductor layer 40. The thicknesses of the nucleation layer 20 and the buffer layer 30 can be tens of nanometers (for example, 30 nm) and several micrometers, (for example, 3 μm) respectively. Materials of the nucleation layer and buffer layer can be group IIIA-VA materials including but not limited to gallium nitride or aluminum nitride.

The first conductivity semiconductor layer 40, for example, an n-type semiconductor layer, is formed on the substrate 10, the nucleation layer 20, and the buffer layer 30. In the embodiment, the thickness of the first conductivity semiconductor layer is several micrometers (for example, 2.5 μm) and the material of the first conductivity semiconductor layer 40 can be gallium nitride. A ratio of group VA source (for example, ammonia) to the group IIIA source (for example, trimethylgallium) can be 1000 for forming the first conductivity semiconductor layer 40. Additionally, by introducing silane as a doping source, GaN layer with silicon dopants can be formed and functions as the first conductivity semiconductor layer 40. The material of the first conductivity semiconductor layer 40 is not limited hereto and can be other group IIIA-VA material.

Similarly, for reducing the lattice mismatch between the first conductivity semiconductor layer 40 and the active layer 60 to decrease the crystal defects, a strain releasing stack 50 can be formed on the first conductivity semiconductor layer 40. The strain releasing stack 50 can have a superlattice structure by alternately stacking two kinds of semiconductor layers with different materials. The two kinds of semiconductor layers can be an indium gallium nitride layer (InGaN) and a gallium nitride layer (GaN), and thicknesses of the indium gallium nitride layer and the gallium nitride layer can be hundreds of nanometers (for example, 120 nm). Otherwise, the strain releasing stack 50 can be multi-layers with different materials and similar efficacy.

Figure 1B:
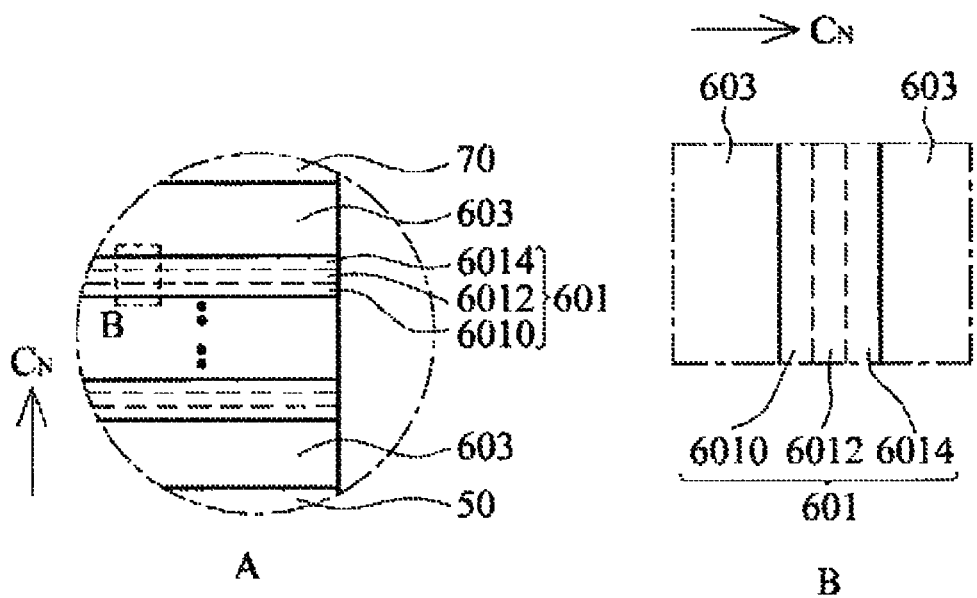
FIG. 1B shows a detailed view of FIG. 1A.
Figure 1C:
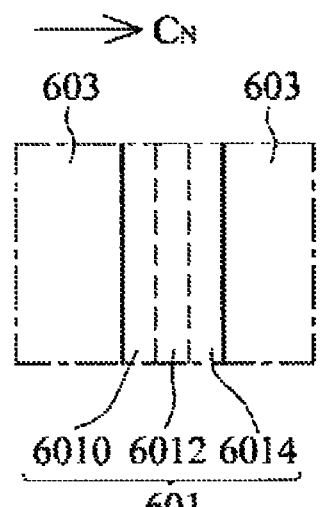
FIG. 1C show a detailed alignment view of FIG. 1B.

The active layer 60 is formed after the strain releasing stack 50 is formed. Please refer to FIGS. 1B and 1C. FIG. 1B shows a detailed view of FIG. 1A and FIG. 1C show a detailed alignment view of FIG. 1B. In the embodiment, the active layer 60 includes a multi-quantum well structure but is not limited to it. In other embodiment, the active layer can include a single quantum well structure and is formed by alternately stacking a plurality of wells 601 and barriers 603. In the embodiment, one barrier 603 is firstly formed on the strain releasing stack 50, one well 601 is formed on such barrier 603, and another barrier 603 and another well 601 are alternately formed on such well 601 repeatedly while the last one is barrier 603 or well 601. The steps of forming the abovementioned multi-quantum well structure of the active layer 60 can include forming the well 601 first, then forming the barrier 603, and alternately forming the well 601 and the barrier 603 repeatedly. The thickness of each of the wells 601 is several nanometers (for example, 2 nm~3 nm), and the well 601 can include three regions designated as region I 6010, region II 6012, and region III 6014. In the embodiment, the region I 6010 is closer to the first conductivity semiconductor layer 40 and the strain releasing stack 50. The region II 6012 is disposed between the region I 6010 and region III 6014, and the region III 6014 is away from the first conductivity semiconductor layer 40 and the strain releasing stack 50. The material of the barrier 603 can include a group IIIA-VA material, for example, gallium nitride or aluminum nitride. The material of the well 601 can include a group IIIA-VA material, for example, $In_xGa_{(1-x)}N$, $Al_xGa_{(1-x)}N$, $Al_xIn_yGa_{(1-x-y)}N$, $Al_xIn_{1-x}N$ or combinations thereof, wherein 0≤x, y<1. In the embodiment, the material of the barrier 603 is gallium nitride and the material of the well 601 is gallium indium nitride. A ratio of the group VA source (for example, ammonia) to the group IIIA source (for example, trimethylindium) can be 18000 for forming the well 601 of the active layer 60; a ratio of the group VA source (for example, ammonia) to the group IIIA source (for example, triethylgallium) can be 2000 for forming the barrier 603 of the active layer 60, but the present application is not limited hereto.

The second conductivity semiconductor layer 70 is formed on the active layer 60. In the embodiment, the second conductivity semiconductor layer 70 can be a p-type conductivity semiconductor layer, for example, a gallium nitride layer doped with magnesium, dopants, but the present application is not limited hereto. The material of the second conductivity semiconductor layer 70 can be other group IIIA-VA material. In the embodiment, a ratio of the group VA source (for example, ammonia) to the group IIIA source (for example, trimethylgallium) can be 5000 for forming the second conductivity semiconductor layer 70 and bis-cyclopentadienyl magnesium can be used as a magnesium dopant source. After the second conductivity semiconductor layer 70 is formed, the first electrode 80 and the second electrode 90 are manufactured by processes, such as lithography, etching, and metal deposition for completing the light-emitting device 1. The abovementioned first conductivity semiconductor layer 40 and the second conductivity semiconductor layer 70 can be single layer or multilayers. Additionally, an undoped semiconductor layer can be disposed on the first conductivity semiconductor layer 40 or the second conductivity semiconductor layer 70.

Figure 2A:
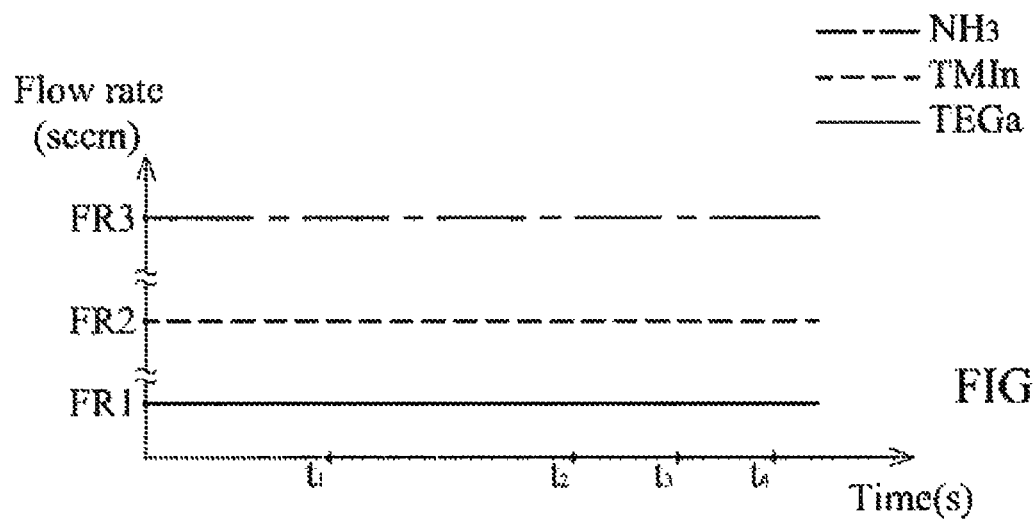
FIG. 2A shows flow rates as functions of time while forming a well and a barrier in accordance with the first embodiment of the present application.
Figure 2B:
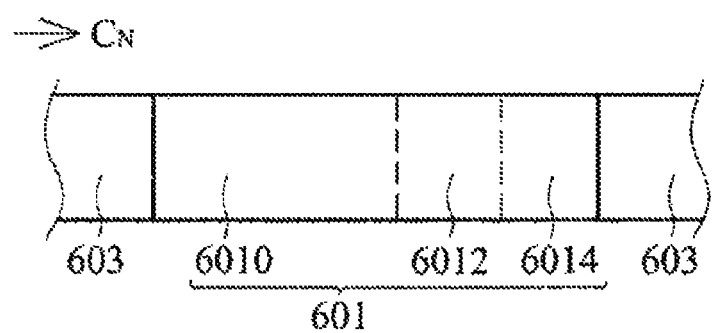
FIG. 2B shows a diagram of the well and the barrier in accordance with the first embodiment of the present application.
Figure 2C:
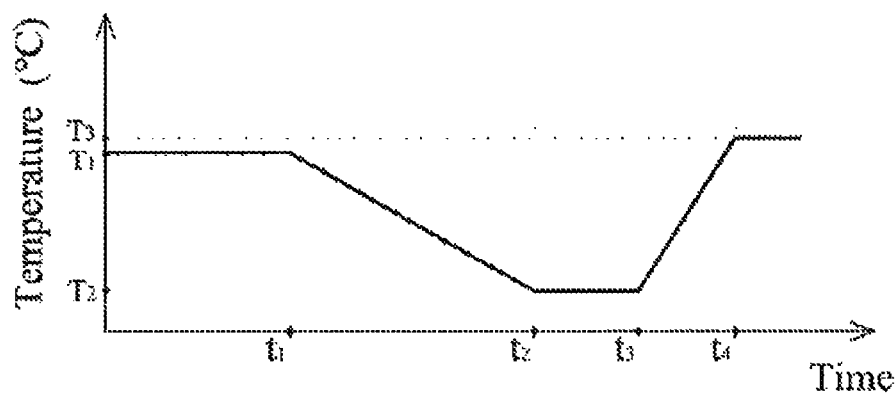
FIG. 2C shows the operational temperature as a function of time while forming the well and the barrier in accordance with the first embodiment of the present application.
Figure 2D:
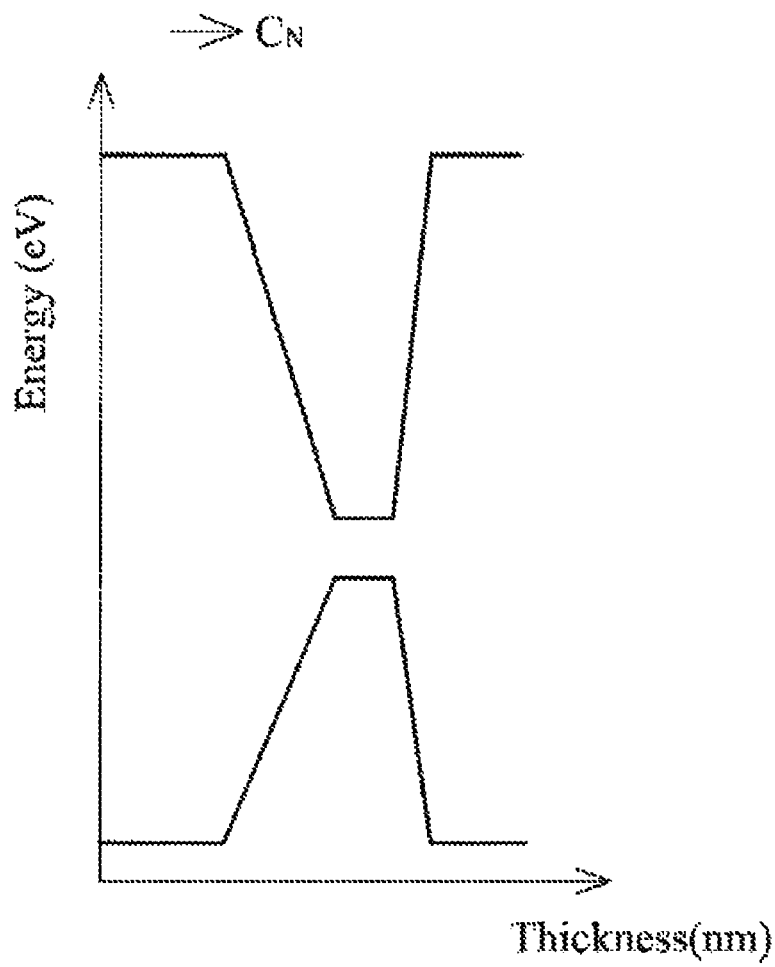
FIG. 2D shows energy bands and structures of the well and the barrier in accordance with the first embodiment of the present application.
Figure 2D:
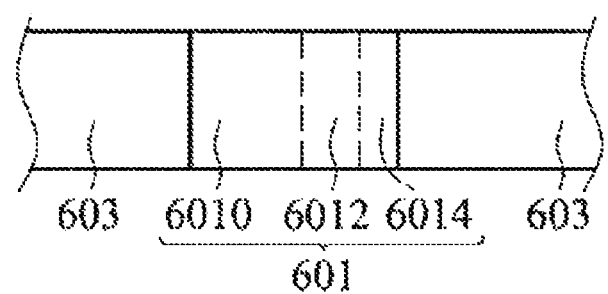

Referring to FIGS. 2A to 2D for further understanding the formation of the active layer 601. FIG. 2A shows flow rates as functions of time while forming the well 601 and the barrier 603 in accordance with the first embodiment of the present application. FIG. 2B shows a diagram of the well 601 and the barrier 603 in accordance with the first embodiment of the present application. FIG. 2C shows operational temperature as a function of time while forming the well 601 and the barrier 603 in accordance with the first embodiment of the present application. FIG. 2D shows energy bands and structures of the well 601 and the barrier 603 in accordance with the first embodiment of the present application. As above mentioned, the active layer 60 is formed by alternately stacking the plurality of wells 601 and barriers 603. As shown in FIGS. 2A to 2D, the well 601 is between two barriers 603. While forming the barrier 603, a gallium based gas such as triethylgallium (TEGa), an indium based gas such as trimethylindium (TMIn) and a nitrogen based gas such as ammonia ($NH_3$) are introduced. In the present embodiment, a flow rate of the gallium based gas FR1, a flow rate of the indium based gas FR2, and a flow rate of the nitrogen based gas FR3 are constants. The operational temperature for forming the barrier 603 can maintain at a first predetermined value $T_1$, for example, 870 degrees Celsius. A thickness of the barrier 603 is several nanometers to tens of nanometers (e.g., 12 nm).

While forming the well 601, in an interval between $t_1$ and $t_2$ (about 160 seconds), the flow rate of the gallium based gas FR1, the flow rate of the indium gas FR2, and the flow rate of nitrogen based gas FR3 can be maintained at fixed values, respectively, and the operational temperature is decreased from the first predetermined value $T_1$ (e.g., 870 degrees Celsius) to a second predetermined value $T_2$, (e.g., 755 degrees Celsius) for forming the region I 6010 of the well 601. The operational temperature can be decreased linearly, stepwise or in other ways. Generally speaking, while epitaxially growing layers by MOCVD, the indium content of the layer is increased as the operational temperature is decreased. In other words, the indium content of the layer is decreased as the operational temperature is increased. By the above-mentioned approaches which adjust the operational temperature, the indium content of the region I 6010 is modulated to be increased along the stacking direction (indicated by arrow $C_N$) of the light-emitting device 1. A composition of the region I 6010 can range from GaN to $In_{0.25}Ga_{0.75}N$, but, the present application is not limited hereto. The rise of the indium content of the region I 6010 can be linear, stepwise or in other ways.

After the region I 6010 is formed, the region II 6012 of the well 601 is formed in an interval between $t_2$ and $t_3$ (about 60 seconds) and the operational temperature is maintained at the second predetermined value $T_2$. Additionally, the flow rate of the gallium based gas FR1, the flow rate of the indium based gas FR2, and the flow rate of the nitrogen based gas FR3 are maintained at predetermined values. In the interval between $t_2$ and $t_3$, the operational temperature is maintained at the second predetermined value $T_2$ and thus the indium content of the region II 6012 is substantially constant (a composition of the region II can be maintained at $In_{0.25}Ga_{0.75}N$).

After the region I 6010 and the region 6012 are formed, the region III 6014 of the well 601 is formed in an interval between $t_3$ and $t_4$. In the interval between $t_3$ and $t_4$, the flow rate of the gallium based gas FR1, the indium based gas FR2, the nitrogen based gas FR3 are maintained at the abovementioned values, and the operational temperature is increased linearly/stepwise to a third predetermined value $T_3$ so that the indium content of the region III 6014 is decreased along the stacking direction. The indium content of the region III 6014 can be decreased linearly or stepwise. Additionally, for the individual well 601, the region III 6014 is closer to the second conductivity semiconductor layer 70 than the region I 6010, and the region II 6012 is formed between the region I 6010 and the region III 6014. In other words, the region I 6010, the region II 6012, and the region III 6014 are formed in sequence. In other embodiment, the sequence can be changed.

After the well 601 is formed, another barrier 603 is formed thereon the gallium based gas such as TEGa, the indium based gas such as TMIn, and the nitrogen based gas such as $NH_3$ are introduced at the same flow rate used in forming the above-mentioned well 601 and the barrier 603, and the operational temperature is maintained at the third predetermined value $T_3$.

Additionally, the region I 6010 has an energy gap EI (not shown in figures). The energy gap EI is decreased linearly, stepwise or in other ways along the stacking direction (indicted by the arrow CN) of the light-emitting device 1 and has a first gradient. In the embodiment, the first gradient $\Delta EI/\Delta DI$ is defined as an energy gap difference per unit thickness in the region I 6010 while the thickness is defined along the stacking direction CN. In the embodiment, indium gallium nitride (InxGa1-xN) functions as the well. The energy gap EI is decreased (x becomes bigger) since the operational temperature is decreased along the stacking direction while forming the region I 6010 so that the indium content is increased.

In other respect, the region II 6012 has an energy gap EII (not shown in figures). Since the operational temperature is maintained at the second predetermined value T2 while forming the region II 6012, the indium content of the region II 6012 is substantially fixed and the energy gap EII can be regarded as a constant. In other words, the energy gap EII is devoid of gradient variation along the stacking direction.

The region III 6014 has an energy gap EIII (not shown in figures) which can be increased linearly, stepwise or in other ways along the stacking direction as above mentioned and has a second gradient EIII/$\Delta$DIII defined as an energy gap difference per unit thickness in the region III 6014. As shown in FIG. 2D, the energy gap EI difference is smaller than the energy gap EIII difference from magnitude point of view. In other words, an absolute value of the first gradient |ΔEI/ΔDI| is smaller than an absolute value of the second gradient |ΔEIII/ΔΔDIII|. It is because while forming the region I 6010, the operational temperature is varied from the first predetermined value T1 to the second predetermined T2 in a longer interval between t1 and t2, for example, 160 seconds, so that the indium content in region I 6010 correspondingly varies from a lower fraction to a higher fraction in such longer interval and the operational temperature varies from the second predetermined value T2 to the third predetermined value T3 in a shorter interval between t3 and t4, for example, 60 seconds, so that the indium content in region III 6014 varies from a higher fraction to a lower fraction in such short interval. Additionally, as shown in FIG. 2D, an average of the energy gap EI and an average of the energy gap EIII are greater than the energy gap EII and the energy gap of the barrier 603 is greater than the energy gap of the well 601.

In the embodiment, although the indium content of each region is adjusted by the operational temperature so that the energy gaps of different regions of the well are varied, the present application is not limited to adjust the operational temperature or the aforementioned gases, and the adjusted content is not limited to indium content. In other embodiment, metal content, for example, aluminum content of the well can be adjusted in other ways so that the energy gap is adjusted and the absolute value of the first gradient |ΔEI/ΔDI| can be smaller or greater than |ΔEIII/ΔDIII|. For example, a material of the barrier can include aluminum nitride (AlN), a material of the well can include aluminum gallium nitride (Al$_x$Ga$_{(1-x)}$N; 0≤x≤1), and the introduced gas can include aluminum based gas. Since the energy gap of aluminum nitride is about 6.1 eV, which is greater than that of gallium nitride 3.4 eV, in order to make the energy gap EI of the region I decrease along the stacking direction and make the energy gap EIII of the region III increase along the stacking direction, aluminum content in the region I can be decreased along the stacking direction and aluminum content in region III can be increased along the stacking direction.

Figure 3A:
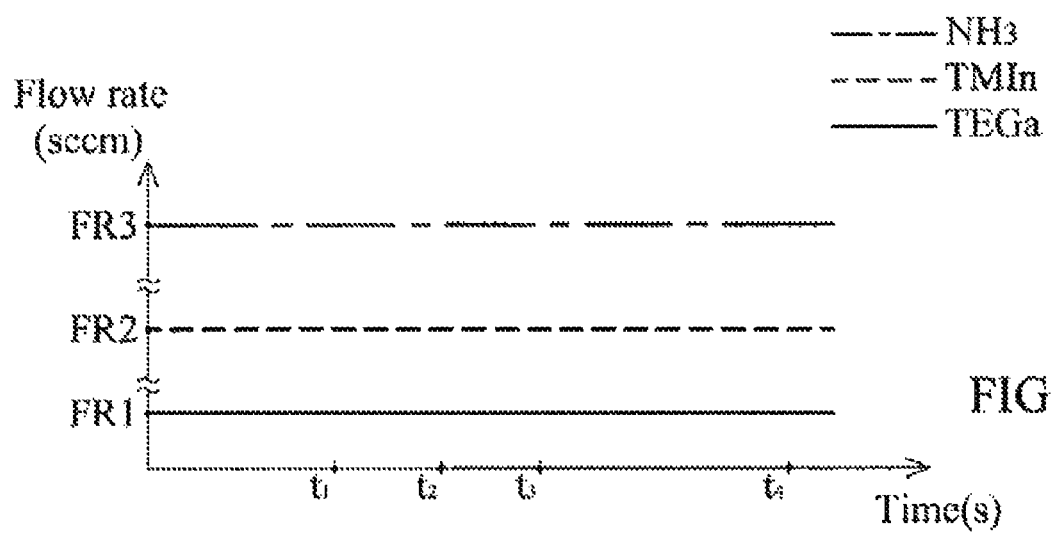
FIG. 3A shows flow rates as functions of time while forming a well and a barrier in accordance with a second embodiment of the present application.
Figure 3B:
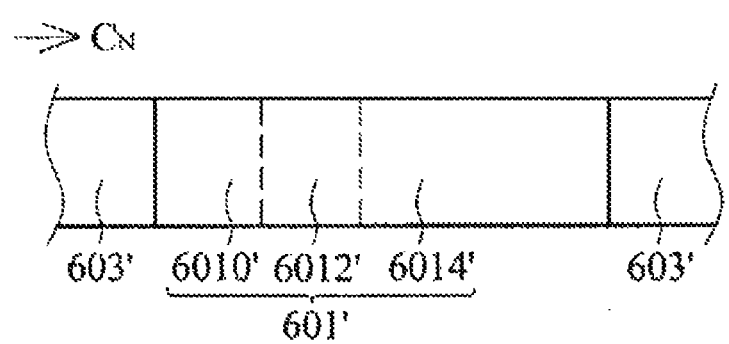
FIG. 3B shows a diagram of the well and the barrier in accordance with the second embodiment of the present application.
Figure 3C:
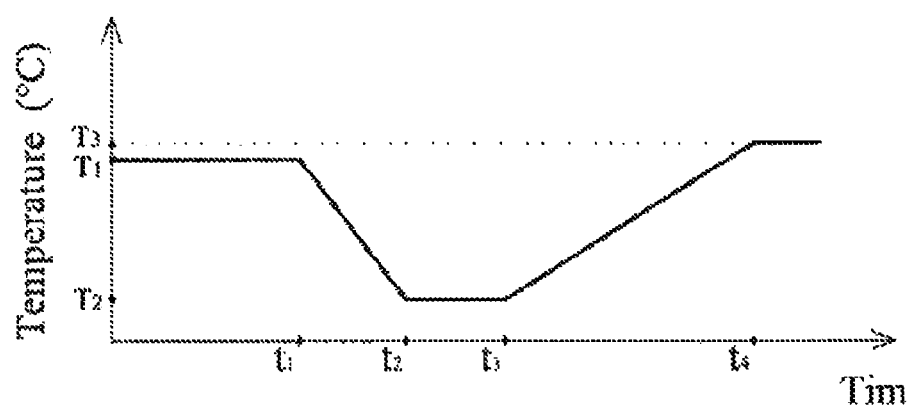
FIG. 3C shows the operational temperature as a function of time while forming the well and the barrier in accordance with the second embodiment of the present application.
Figure 3D:
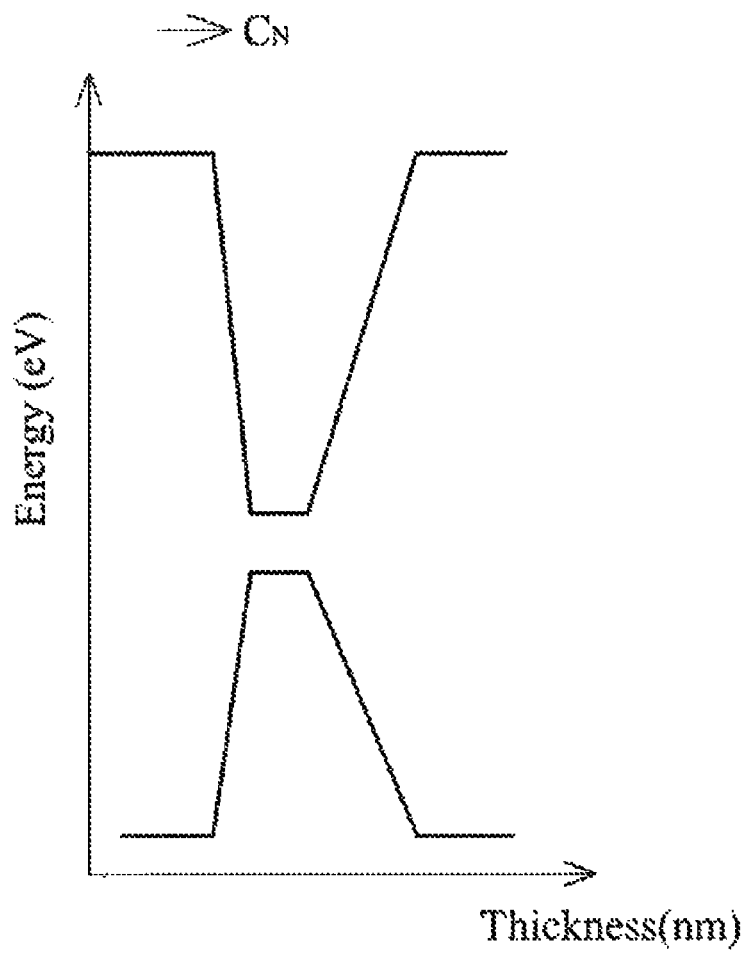
FIG. 3D shows energy bands and structures of the well and the barrier in accordance with the second embodiment of the present application.
Figure 3D:
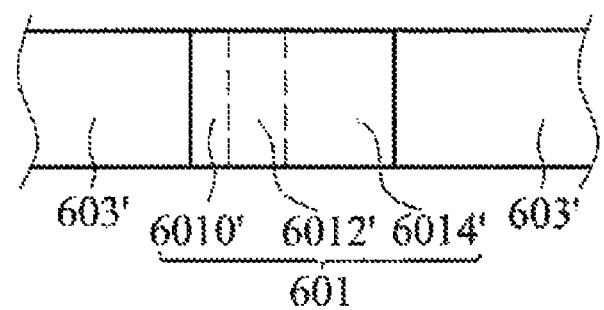

As shown in FIGS. 3A to 3D, FIG. 3A shows flow rates as functions of time while forming the well and the barrier in accordance with the second embodiment of the present application, FIG. 3B shows a diagram of the well and the barrier in accordance with the second embodiment of the present application, FIG. 3C shows the operational temperature as a function of time while forming the well and the barrier in accordance with the second embodiment of the present application, and FIG. 3D shows energy bands and structures of the well and the barrier in accordance with the second embodiment of the present application. The second embodiment in FIG. 3A to FIG. 3D is similar to the first embodiment in FIG. 2A to FIG. 2D. One difference is in the structure of the well of the active layer. In the second embodiment, the active layer includes a well 601' and at least two barriers 603'. Similarly, a region I 6010' of the well 601' is formed in the interval between t1 and t2 and a region II 6012' of the well 601' is formed in the interval between t3 and t4. In the embodiment, a composition of the region I 6010' is ranged from GaN to In0.25Ga0.75N, a composition of the region II is In0.25Ga0.75N, and a composition of the region III 6014' is ranged from In0.25GaN0.75N to GaN. Another difference between the first embodiment and the second embodiment is the interval between t1 and t2 shown in FIGS. 3A to 3D is shorter than the interval between t3 and t4 and thus an indium content difference per unit time in the interval between t1 and t2 is greater than an indium content difference per unit time in the interval between t3 and t4. Accordingly, as shown in FIG. 3D, an energy gap EI' difference of the region 6010' per unit thickness DI' is smaller than an energy gap EIII'' difference of the region 6014' per unit thickness DIII' from magnitude point of view. In other words, an absolute value of a first gradient |ΔEI/ΔDI| in the second embodiment is greater than an absolute value of a second gradient in the second embodiment |ΔEIII/ΔDIII|.

In the present application, the intervals between $t_1$ and $t_2$, $t_2$ and $t_3$, and $t_3$ and $t_4$ are not limited to 160 seconds, 60 seconds, and 60 seconds or 60 seconds, 60 seconds, and 160 seconds. In other embodiment, in order to vary indium contents in different ways in different intervals, the intervals can correspond to different durations. For example, the interval between $t_1$ and $t_2$ can be 2 to 3 times of the interval between $t_3$ and $t_4$, the interval between $t_1$ and $t_2$ is shorter than the interval between $t_3$ and $t_4$, or the interval between $t_1$ and $t_2$ and the interval between $t_2$ and $t_3$ are longer than the interval between $t_1$ and $t_2$. But the present application is not limited hereto. As long as the operational temperature difference (absolute value) per unit time in the interval between $t_1$ and $t_2$ is different from the operational temperature difference (absolute value) per unit time in the interval between $t_3$ and $t_4$, absolute values of the indium contents per unit thickness (gradient) in the region I and region III are different from each other. Additionally, the first predetermined value, the second predetermined value, and the third predetermined are not limited to 870 degrees Celsius, 755 degrees Celsius, and 875 degrees Celsius. The first predetermined value and the third predetermined value can be greater than the second predetermined value. In other embodiment, the first predetermined value and the third predetermined can be about 900 degrees Celsius and the second predetermined value can be smaller than 900 degrees Celsius. Moreover, in other embodiment, the first predetermined can be between 870 degrees Celsius and 900 degrees Celsius, the second predetermined value can be between 750 degrees Celsius and 780 degrees Celsius, and the third predetermined value can be between 870 degrees Celsius and 900 degrees Celsius.

Figure 4:
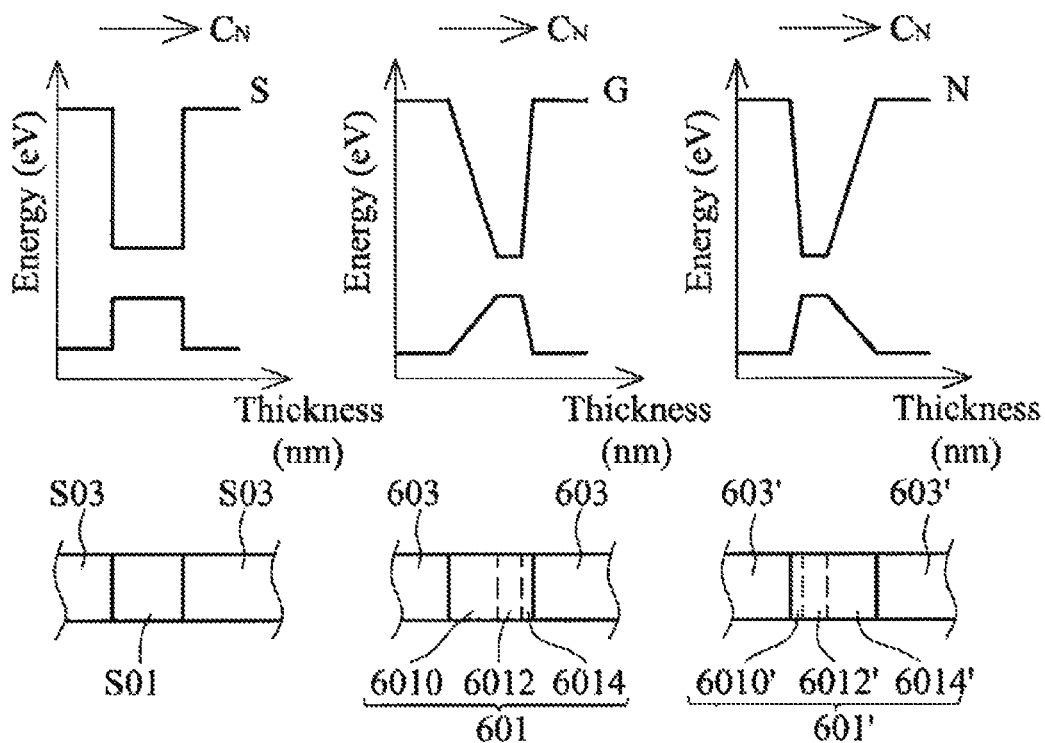
FIG. 4 shows energy bands of the wells and the barriers of light-emitting devices in accordance with the first embodiment and the second embodiment of the present application and the conventional art.

FIG. 4 shows energy bands of wells and barriers of light-emitting devices in accordance with the first embodiment and the second embodiment of the present application and the conventional art. In FIG. 4, S represents the conventional light-emitting device, G represents the light-emitting device of the first embodiment, and N represents the light-emitting device of the second embodiment. In FIG. 4, materials of a well S01 and a barrier S03 of the conventional light-emitting device can include indium gallium nitride (In$_{0.25}$Ga$_{0.75}$N) and gallium nitride GaN, respectively. The energy gap of the well S01 is fixed and is not varied with its thickness.

Figure 5:
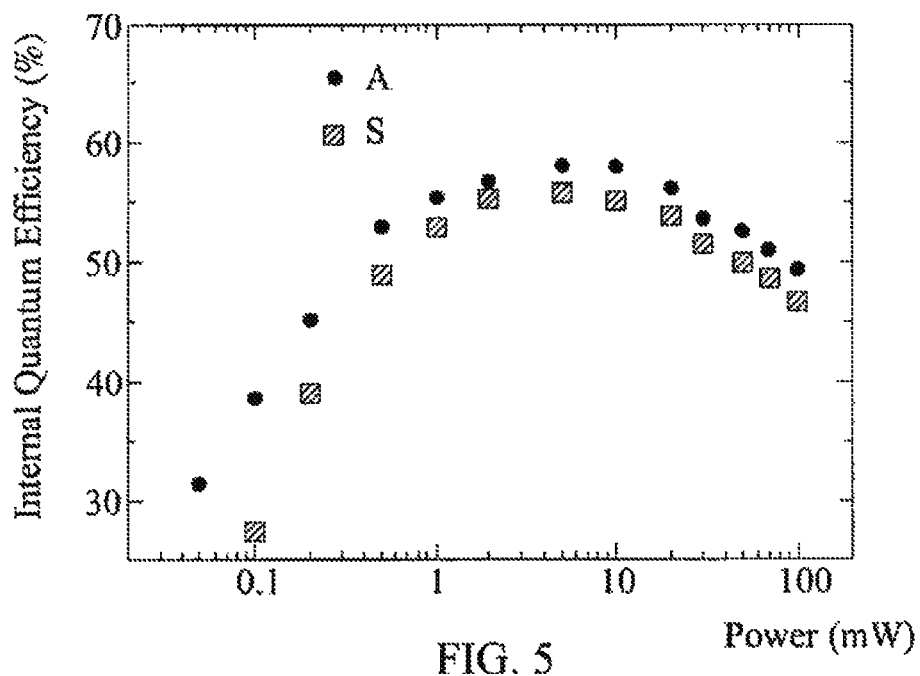
FIG. 5 shows internal quantum efficiency as functions of power for the light-emitting devices in accordance with the first embodiment and the second embodiment of the present application and the conventional art.

FIG. 5 shows internal quantum efficiency as functions of power for the light-emitting devices in accordance with the first embodiment and the second embodiment of the present application and the conventional art. As shown in FIG. 5, S represents the conventional light-emitting device in FIG. 4 and A represents both of the light-emitting devices of the first embodiment and the second embodiment. In FIG. 5, it shows the internal quantum efficiency of the light-emitting devices of the first embodiment and the second embodiment is higher than the internal quantum efficiency of the light-emitting device of the conventional art at the same power value.

Figure 6A:
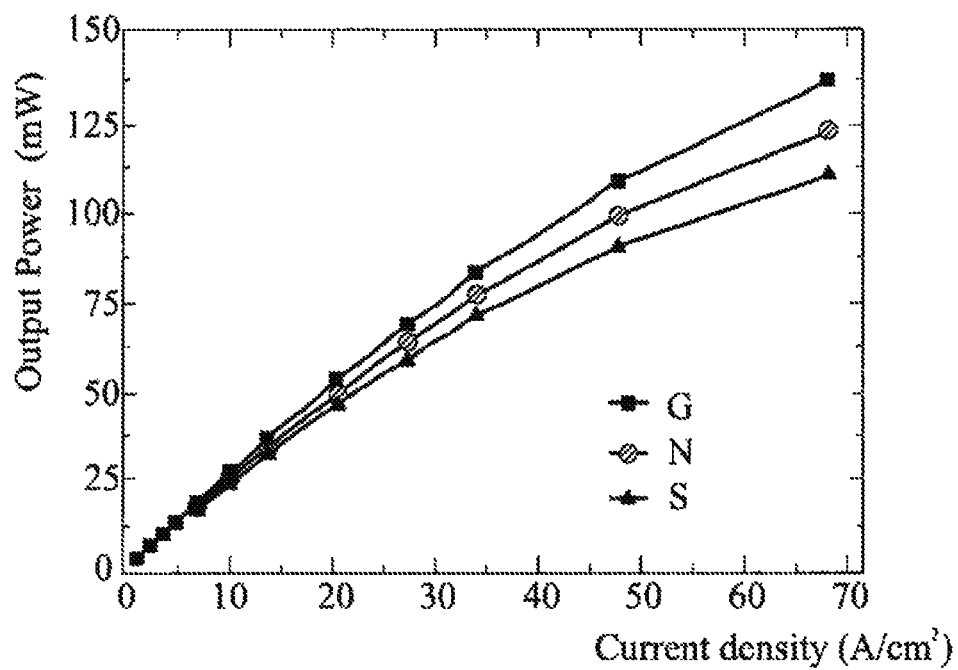
FIG. 6A shows output power as functions of current density for the light-emitting devices in accordance with the first embodiment and the second embodiment of the present application and the conventional art.
Figure 6B:
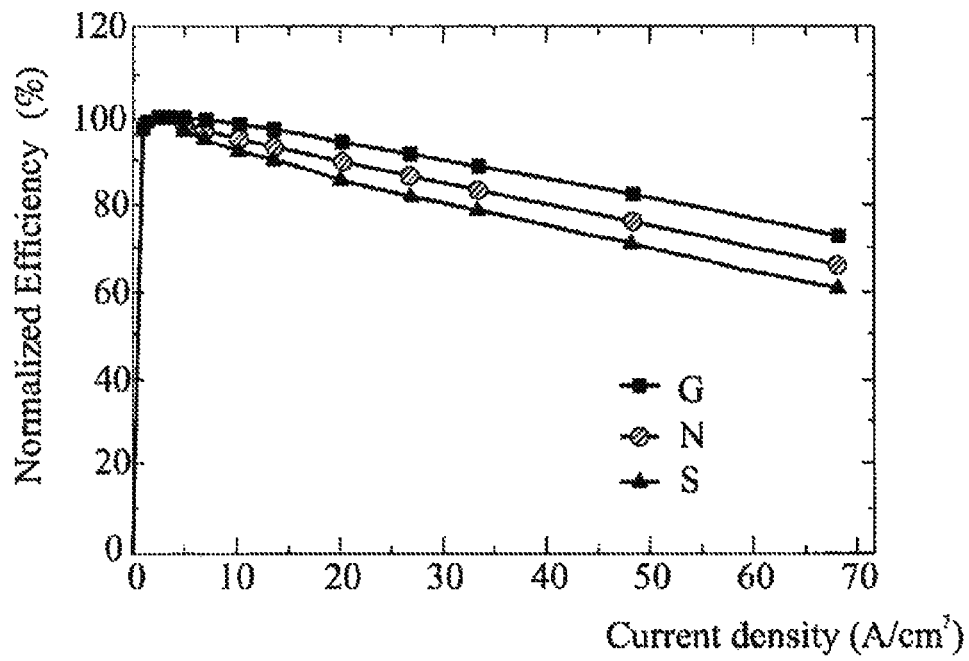
FIG. 6B shows normalized efficiency as functions of current density for the light-emitting devices in accordance with the first embodiment and the second embodiment of the present application and the conventional art.

Please refer to FIGS. 6A and 6B. FIG. 6A shows output power as functions of current density for the light-emitting devices in accordance with the first embodiment and the second embodiment of the present application and the conventional art. FIG. 6B shows the normalized efficiency as functions of current density for the light-emitting devices in accordance with the first embodiment and the second embodiment of the present application and the conventional art. In FIGS. 6A and 6B, S represents the conventional light-emitting device, G represents the light-emitting device of the first embodiment, and N represents the light-emitting device of second embodiment. In FIG. 6A, the light-emitting devices are measured at room temperature; in FIG. 6B, the measured output power value of each of the light-emitting devices at room temperature is normalized by the measured output power value of each of the light-emitting devices at low temperature so that a trend of the efficiency of the light-emitting device increasing with the current density is investigated. As shown in FIG. 6A, at the same voltage and a current density of 69 A/cm$^2$, output power values of the light-emitting devices of the first embodiment, the second embodiment, and the conventional art are 136.8 mW, 122.7 mW, and 110.1 mW, respectively. The output power values of the light-emitting devices of the first embodiment and the second embodiment are increased by 24.3% and 11.4%, respectively, compared with the conventional light-emitting device. As shown In FIG. 6B, at a current density of 69 A/cm$^2$, the normalized efficiency values of the light-emitting devices of the first embodiment and the conventional art are 73% and 61%, respectively. That means an efficiency declining rate of the light-emitting device of the present application is lower than that of the conventional light-emitting device as the current density is increased.

In the embodiment, the external quantum efficiency (EQE) at a current density of 13.8 A/cm$^2$ for the light-emitting devices of the conventional art, the first embodiment, and the second embodiment are approximately 59.6%, 68.3%, and 66.5%, respectively. The output power values of the light-emitting device of the first embodiment and the second embodiment are increased by 11.7% and 5.8%, respectively, compared with the light-emitting device of the conventional art. As above mentioned, at a current density of 13.8 A/cm$^2$ or 69 A/cm$^2$, the output power and the efficiency of the light-emitting devices of the first embodiment and the second embodiment are higher than that of the light-emitting device of the conventional art.

Figure 7A:
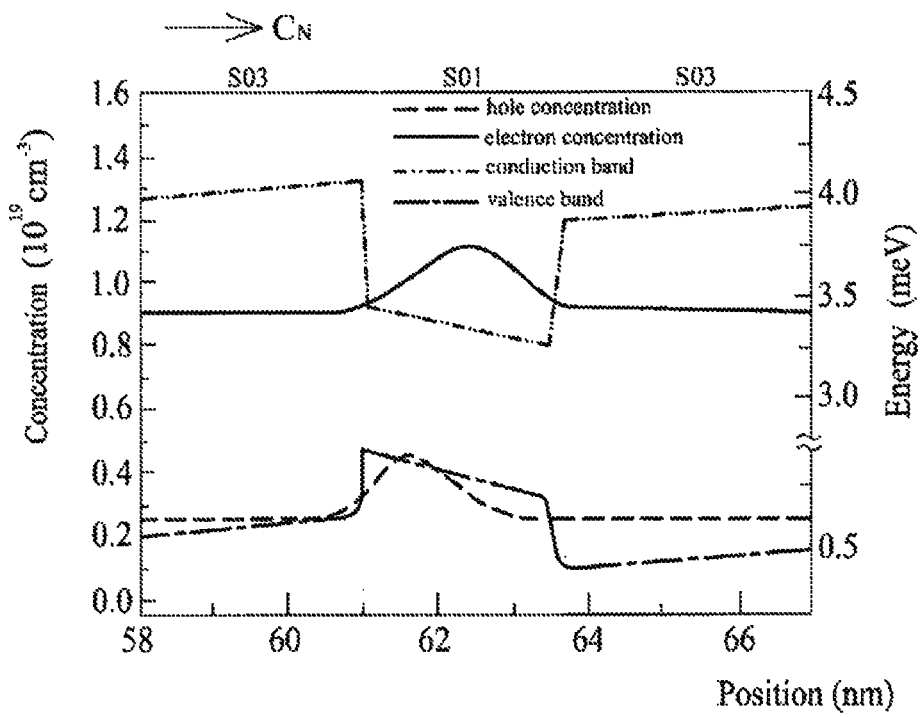
FIG. 7A shows concentration of carriers as functions of position and energy band as functions of position for the well and the barrier for the light-emitting device in accordance with the conventional art.
Figure 7B:
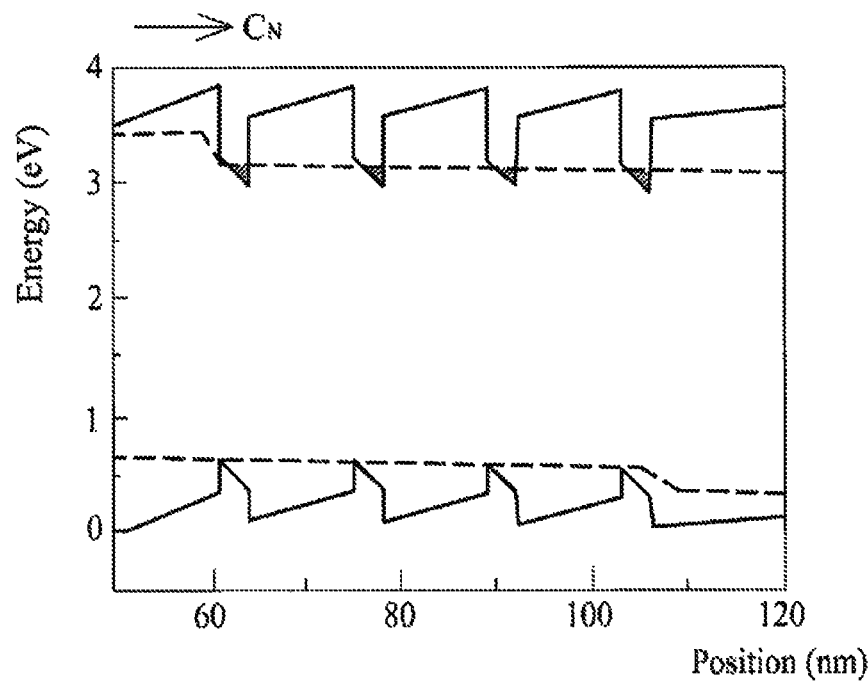
FIG. 7B shows energy bands of the well and the barrier and Femi energies of electrons and holes for the light-emitting device in accordance with the conventional art.
Figure 8A:
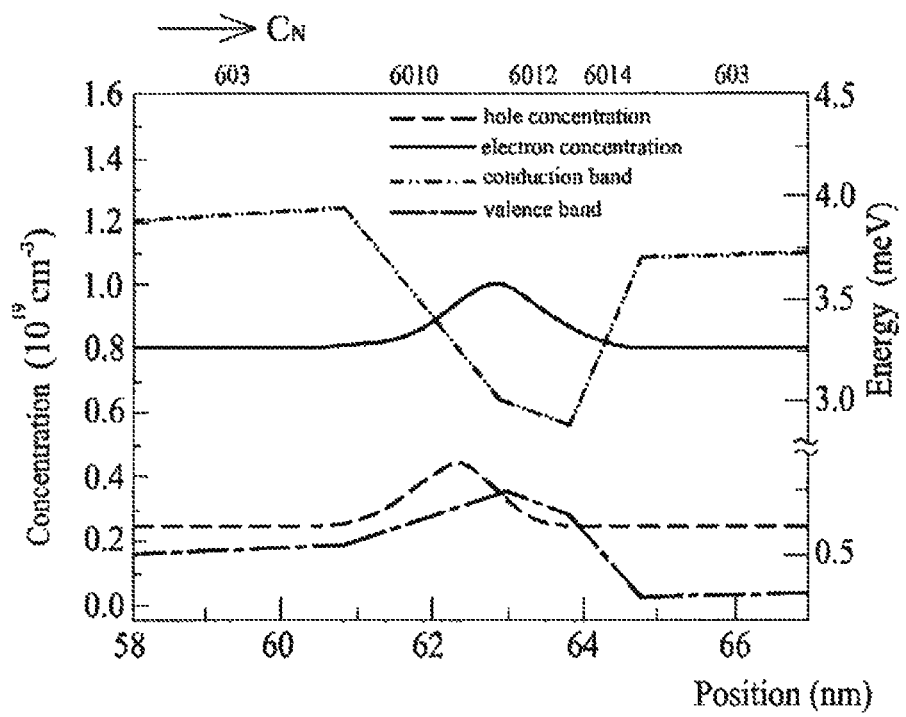
FIG. 8A shows concentration of carriers as functions of position and energy band as functions of position for the well and the barrier in accordance with the first embodiment of the present application.
Figure 8B:
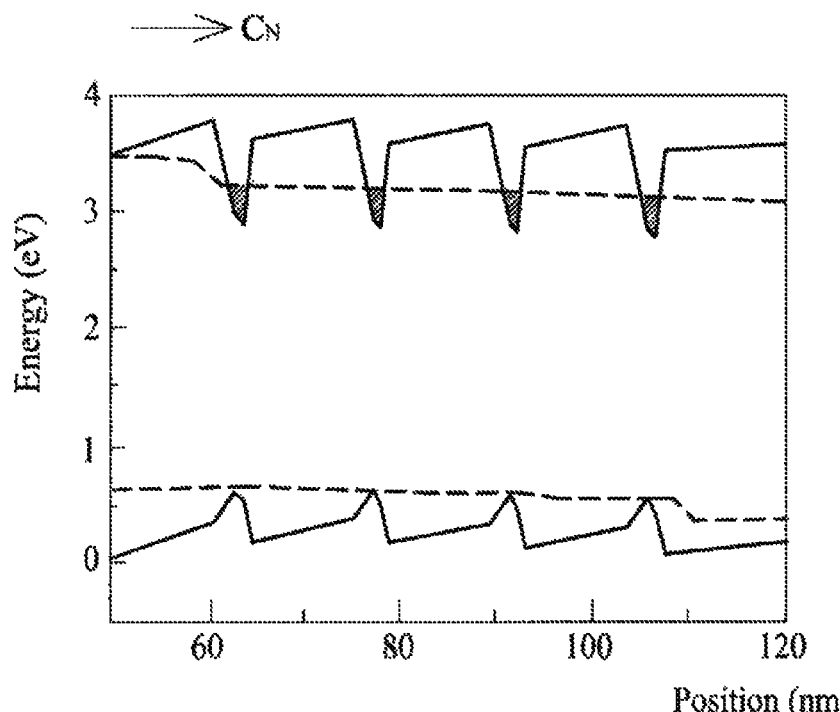
FIG. 8B shows energy bands of the well and the barrier and Femi energies of electrons and holes in accordance with the first embodiment of the present application.
Figure 9A:
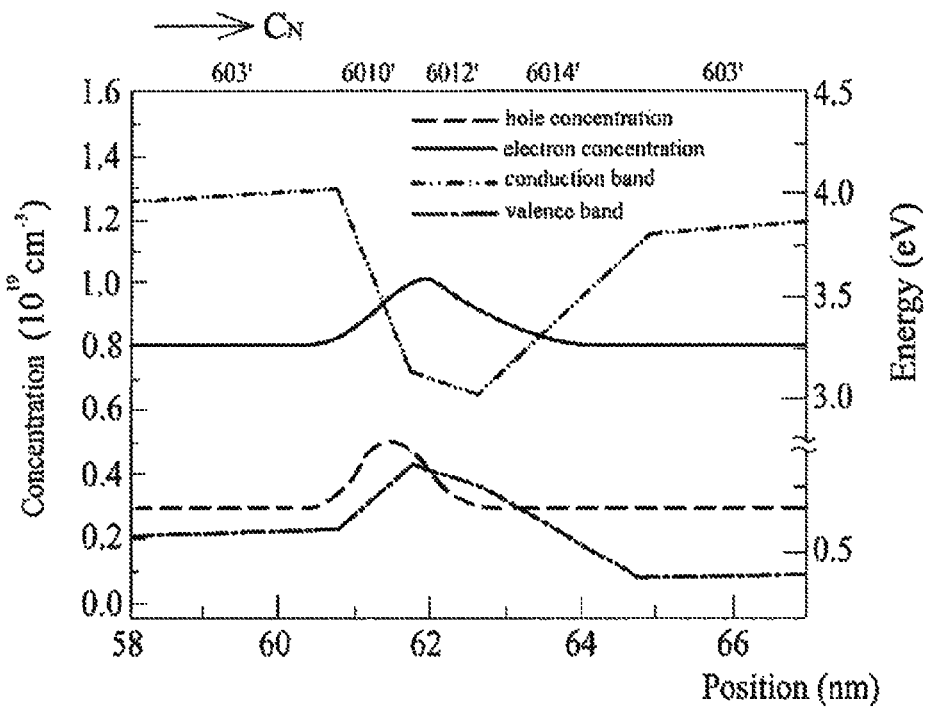
FIG. 9A shows concentration of carriers as functions of position and energy band as functions of position for the well and the barrier in accordance with the second embodiment of the present application.

Please refer to FIGS. 7A, 8A and 9A. FIGS. 7A to 9A show simulations of concentrations of carriers versus position and energy bands of the well and the barrier versus position under bias. FIG. 7A shows concentration of carriers as functions of position and energy bands as functions of position for the well and the barrier for the light-emitting device in accordance with the conventional art. FIG. 8A shows concentration of carriers as functions of position and energy bands as functions of position for the well 601 and the barrier 603 in accordance with the first embodiment of the present application. FIG. 9A shows concentration of carriers as functions of position and energy bands as functions of position for the well 601' and the barrier 603' in accordance with the second embodiment of the present application. In FIGS. 7A, 8A, and 9A, the structures (i.e. barrier, well, region I, region II, region III) are labeled. As shown in FIGS. 7A, 8A, and 9A, higher concentration of carriers (electrons/holes) presents in the well. In the light-emitting device of the first embodiment or the second embodiment, a position of a peak value of the concentration of electrons s is closer to a position of a peak value of the concentration of holes, compared with the conventional light-emitting device. It means that each wave function distribution of the electrons and the holes of the first embodiment and the second embodiment overlaps more than that of the light-emitting device of the conventional art and the recombination rates in the light-emitting devices of the first embodiment and the second embodiment are greater than the recombination rate of the conventional light-emitting device. As shown in FIG. 8A, the variation of the energy gap in region I 6010 of the well is smaller than the variation of the energy gap in the region III 6014. While operating the light-emitting of the first embodiment, the electrons move from the region I 6010 to the region III 6014 and the holes move from the region III 6014 to the region I 6010. With the above structure, the speed of the holes is increased and the movement of electrons is restrained so as to increase the efficiency and decrease electrons overflow.

Figure 9B:
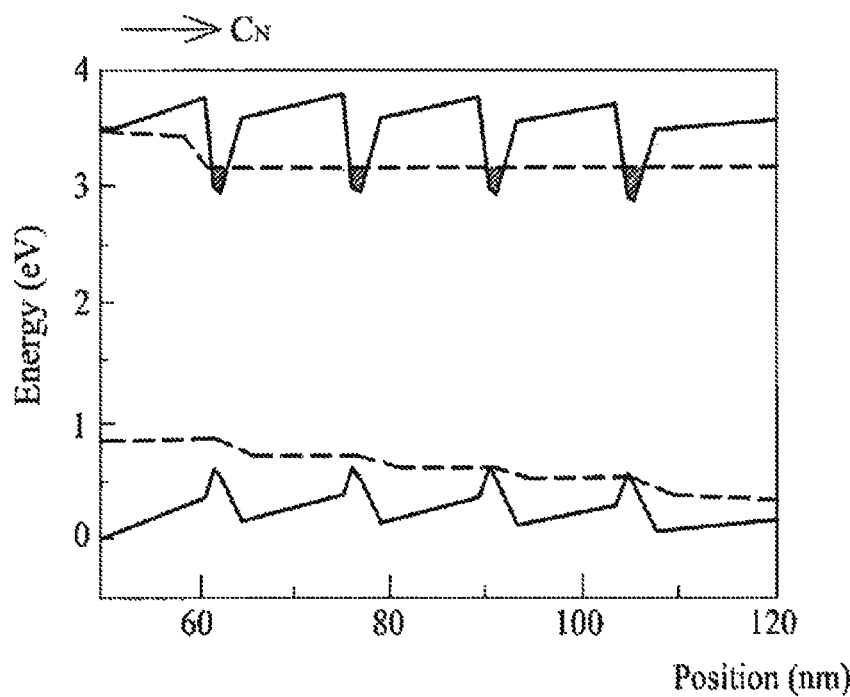
FIG. 9B shows energy bands of the well and the barrier and Femi energies of electrons and holes in accordance with the second embodiment of the present application.

FIGS. 7B, 8B and 9B show simulations energy bands of the well and the barrier and Femi energies of electrons and holes under bias. FIG. 7B shows energy bands of the well and the barrier and Femi energies of electrons and holes for the light-emitting device in accordance with the conventional art. FIG. 8B shows energy bands of the well and the barrier and Femi energies of electrons and holes in accordance with the first embodiment of the present application. FIG. 9B shows energy bands of the well and the barrier and Femi energies of electrons and holes in accordance with the second embodiment of the present application. There are four lines shown in the FIGS. 7B, 8B, and 9E. An upper line and an upper broken line in figures represent a conduction band profile and Femi energy of electrons, respectively; a lower line and a lower broken line in figures represent a valance band profile and Femi energy of holes, respectively. In comparison with FIG. 7B, the Femi energy of electrons in FIG. 8B is away from the minimum (valley value) of the conduction band. It means the probability that electrons present in the well 601 is higher than the probability that electrons present in the well S01. Additionally, the area (as slash lines shown) defined by the Femi energy and the conduction band in FIG. 8B is higher than that of in FIG. 7B. That represents the amount of electrons in the well 601 is higher than that of in the well S01.

Figure 10:
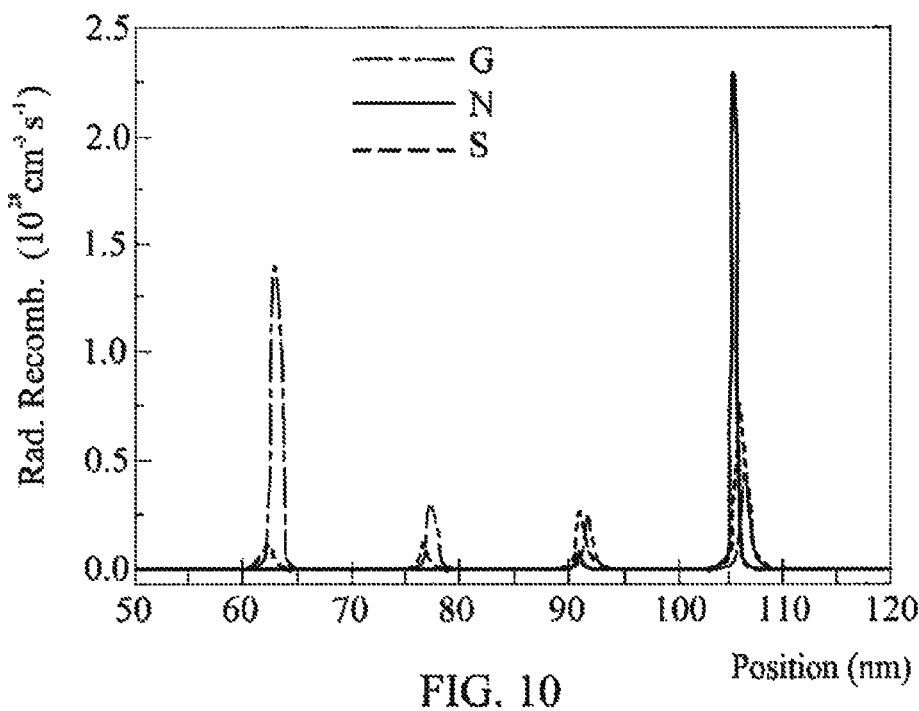
FIG. 10 shows a simulation of the recombination rate as functions of position for the light-emitting devices in accordance with the first embodiment and the second embodiment of the present application and the conventional art.

Please refer to FIG. 10 shows a simulation of the recombination rate as functions of position for the light-emitting devices in accordance with the first embodiment of the present application and the conventional art. S, G, and N represent a conventional light-emitting device, the light-emitting devices of the first embodiment and the second embodiment, respectively. As shown in FIG. 10, recombination rates of the active layers of the light-emitting devices of the first embodiment, the second embodiment are greater than that of the conventional light-emitting device.

Figure 11:
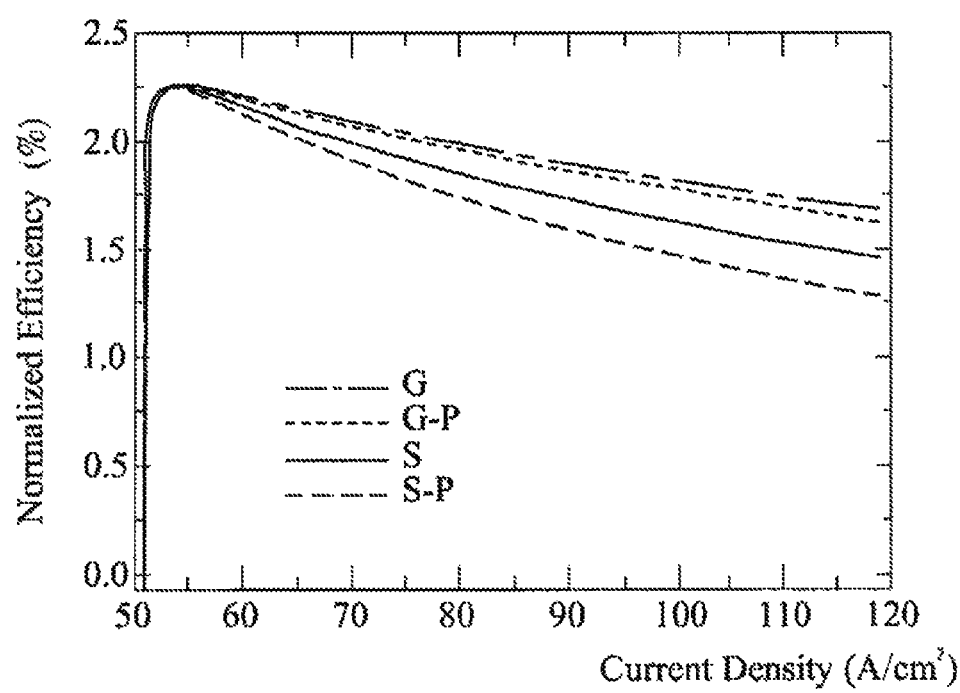
FIG. 11 shows a simulation of the normalized efficiency as functions of current density for the light-emitting devices in accordance with the first embodiment of the present application and the conventional art.

Please refer to FIG. 11, FIG. 11 shows a simulation of the normalized efficiency as functions of current density for the light-emitting devices in accordance with the first embodiment of the present application and the conventional art. S and G represent a conventional light-emitting device without a polarization field and the light-emitting device of the first embodiment without a polarization field, respectively. S-P and G-P represent a conventional light-emitting device with a polarization filed (0.7 Mvolt·cm$^{-1}$) and the light-emitting device of the first embodiment of the present application with a polarization filed (0.7 Mvolt·cm$^{-1}$) respectively. As shown in FIG. 11, regardless of a polarization filed, a declining rate of the efficiency of the light-emitting device of the first embodiment of the present application is smaller than that of the conventional light-emitting device.

The principle and the efficiency of the present application illustrated by the embodiments above are not the limitation of the present application. Any person having ordinary skill in the art can modify or change the aforementioned embodiments. Therefore, the protection range of the rights in the present application will be listed as the following claims.

What is claimed is:

1. A method of manufacturing a light-emitting device comprising steps of:
   forming a first conductivity semiconductor layer on a substrate;
   forming a first barrier on the first conductivity semiconductor layer;
   forming a well on the first barrier, wherein the step of forming the well further comprises:
      forming a first region at a first operational temperature in a first interval; and
      forming a second region at a second operational temperature in a second interval, wherein the first interval is followed by the second interval;
   forming a second barrier on the well; and
   forming a second conductivity semiconductor layer on the second barrier, wherein the steps of forming the well, the first barrier, and the second barrier comprising introducing a gallium based gas, an indium based gas, and a nitrogen based gas, and a flow rate of the gallium based gas, a flow rate of the indium based gas, and a flow rate of the nitrogen based gas are maintained at fixed values, respectively; wherein an absolute value of a slope of the second operational temperature versus time in the second interval is different from an absolute value of a slope of the first operational temperature versus time in the first interval.

2. The method of claim 1, further comprising:
   forming a buffer layer between the substrate and the first conductivity semiconductor layer; and
   forming a strain releasing stack between the first conductivity semiconductor layer and the first barrier.

3. The method of claim 1, wherein the first operational temperature is decreased linearly or stepwise from a first predetermined value to a second predetermined value in the first interval, the second operational temperature is increased linearly or stepwise from the second predetermined value to a third predetermined value in the second interval, and the third predetermined value is greater than the first predetermined value.

4. The method of claim 3, wherein the step of forming the well further comprises forming a third region by introducing the gallium based gas, the indium based gas, and the nitrogen based gas at a third operational temperature in a third interval, the third interval is between the first interval and the second interval, and the third operational temperature maintains at the second predetermined value.

5. The method of claim 4, wherein the step of forming the first barrier further comprises introducing the gallium based gas and the nitrogen based gas at the first predetermined value.

6. The method of claim 4, wherein the step of forming the second barrier further comprises introducing the gallium based gas and the nitrogen based gas at the third predetermined value.

7. The method of claim 4, wherein the first predetermined value is between 870 degrees Celsius and 900 degrees Celsius and the second predetermined value is between 750 degrees Celsius and 780 degrees Celsius.

8. The method of claim 1, wherein the first interval is two to three times of the second interval or the second interval is two to three times of the first interval.

9. A method of manufacturing a light-emitting device comprising steps of:
   forming a first conductivity semiconductor layer on a substrate;
   forming a first barrier on the first conductivity semiconductor layer;
   forming a well on the first barrier, wherein the well comprises a first region and a second region on the first region along a stacking direction and the steps comprise:
      forming the first region by introducing a gallium based gas, an indium based gas, and a nitrogen based gas at a first operational temperature in a first interval, wherein flow rates of the gallium based gas, the indium based gas, and the nitrogen based gas are maintained at fixed values; and
      forming the second region by introducing the gallium based gas, the indium based gas, and the nitrogen based gas at a second operational temperature in a second interval after forming the first region;
   forming a second barrier on the well; and
   forming a second conductivity semiconductor layer on the second barrier; wherein the first region has a first energy gap and the second region has a second energy gap, the first energy gap is decreased along the stacking direction and has a first gradient, the second energy gap is increased along the stacking direction and has a second gradient, and an absolute value of the first gradient is smaller than an absolute value of the second gradient; wherein an absolute value of a slope of the second operational temperature versus time in the second interval is different from an absolute value of a slope of the first operational temperature versus time in the first interval.

10. The method of claim 9, further comprising:
    forming a buffer layer between the substrate and the first conductivity semiconductor layer; and
    forming a strain releasing stack between the first conductivity semiconductor layer and the first barrier.

11. The method of claim 9, wherein a flow rate of the gallium based gas, a flow rate of the indium based gas, and a flow rate of the nitrogen based gas are constants, respectively.

12. The method of claim 9, wherein the first operational temperature is decreased linearly or stepwise from a first predetermined value to a second predetermined value in the first interval, the second operational temperature is increased linearly or stepwise from the second predetermined value to a third predetermined value in the second interval, and the third predetermined value is greater than the first predetermined value.

13. The method of claim 12, wherein the step of forming the well further comprises forming a third region by introducing the gallium based gas, the indium based gas, and the nitrogen based gas at a third operational temperature in a third interval, the third interval is between the first interval and the second interval, and the third operational temperature maintains at the second predetermined value.

14. The method of claim 13, wherein the step of forming the first barrier further comprises introducing the gallium base gas and the nitrogen based gas at the first predetermined value.

15. The method of claim 13, wherein the step of forming the second barrier further comprises introducing the gallium based gas and the nitrogen based gas at the third predetermined value.

16. The method of claim 13, wherein the first predetermined value is between 870 degrees Celsius and 900 degrees Celsius and the second predetermined value is between 750 degrees Celsius and 780 degrees Celsius.

17. The method of claim 9, wherein the first interval is two to three times of the second interval.

* * * * *